United States Patent
Stengl et al.

(10) Patent No.: US 7,214,951 B2
(45) Date of Patent: May 8, 2007

(54) CHARGED-PARTICLE MULTI-BEAM EXPOSURE APPARATUS

(75) Inventors: Gerhard Stengl, Wernberg (AT); Elmar Platzgummer, Vienna (AT); Hans Loschner, Vienna (AT)

(73) Assignee: IMS Nanofabrication GmbH, Vienna (AT)

( * ) Notice: Subject to any disclaimer, the term of this patent is extended or adjusted under 35 U.S.C. 154(b) by 172 days.

(21) Appl. No.: 10/969,493

(22) Filed: Oct. 20, 2004

(65) Prior Publication Data
US 2005/0104013 A1  May 19, 2005

(30) Foreign Application Priority Data
Oct. 20, 2003  (AT) .............................. A 1660/2003

(51) Int. Cl.
*H01J 37/08* (2006.01)
*G21G 5/00* (2006.01)
(52) U.S. Cl. .............................. 250/492.23; 250/492.21
(58) Field of Classification Search ............ 250/492.23
See application file for complete search history.

(56) References Cited

U.S. PATENT DOCUMENTS

| | | | |
|---|---|---|---|
| 4,209,702 A | 6/1980 | Shirai et al. | |
| 4,694,178 A | 9/1987 | Harte | |
| 4,967,088 A | 10/1990 | Stengl et al. | |
| 4,985,634 A | 1/1991 | Stengl et al. | |
| 5,012,105 A * | 4/1991 | Ando et al. | 250/398 |
| 6,768,125 B2 | 7/2004 | Platzgummer et al. | |
| 6,777,694 B2 * | 8/2004 | Haraguchi | 250/492.2 |
| 2001/0032939 A1 | 10/2001 | Gerlach et al. | |
| 2002/0117967 A1 | 8/2002 | Gerlach et al. | |
| 2004/0021095 A1 * | 2/2004 | Sohda et al. | 250/492.22 |
| 2005/0134819 A1 * | 6/2005 | de Jager | 355/55 |

FOREIGN PATENT DOCUMENTS

GB  2340 991  3/2000

OTHER PUBLICATIONS

N. C. Yew; "A Modular System for Electron Beam Microfabrication"; proceedings of Electron and Ion Beam Science and Technology, ed, B. Bakish (1974); United States; pp. 111-122.

(Continued)

*Primary Examiner*—Nikita Wells
*Assistant Examiner*—Jams J. Leyourne
(74) *Attorney, Agent, or Firm*—RatnerPrestia

(57) ABSTRACT

A charged-particle multi-beam exposure apparatus (1) for exposure of a target (41) uses a plurality of beams of electrically charged particles, which propagate along parallel beam paths towards the target (41). For each particle beam an illumination system (10), a pattern definition means (20) and a projection optics system (30) are provided. The illuminating system (10) and/or the projection optics system (30) comprise particle-optical lenses having lens elements (L1, L2, L3, L4, L5) common to more than one particle beam. The pattern definition means (20) defines a multitude of beamlets in the respective particle beam, forming its shape into a desired pattern which is projected onto the target (41), by allowing it to pass only through a plurality of apertures defining the shape of beamlets permeating said apertures, and further comprises a blanking means to switch off the passage of selected beamlets from the respective paths of the beamlets.

23 Claims, 10 Drawing Sheets

OTHER PUBLICATIONS

N. W. Parker et al; "A High Throughput NGL Electron Beam Direct-Write Lithography System"; SPIE vol. 3997 (2000); United States; pp. 713-720.

E. Yin et al.; "Electron Optical Column for a Multicolumn, Multibeam Direct-Write Electron Beam Lithography System"; J. Vac. Sci, Technol. B 18; Nov./Dec. 2000; United States; pp. 3126-3131.

T.H.P. Chang et al.; "Microminiaturization of Electron Optical Systems", J. Vac. Sci. Technol. B8; Nov./Dec. 1990; United States; pp. 1698-1705.

T.H.P. Chang et al.; "Electron-Beam Microcolumns for Lithography and Related Applications"; J. Vac. Sci. Technol. B14; Nov./Dec. 1996; United States; pp. 3774-3781.

N. Shimazu et al.; "An Approach to Multiple E-Beam System"; proceedings of the "International Workshop on High Throughput Charged Particle Lithography"; Aug. 11-15, 1997; Hawaii; pp. 1-4.

GB Search Report GB 0423152.8 dated Mar. 9, 2005.

* cited by examiner

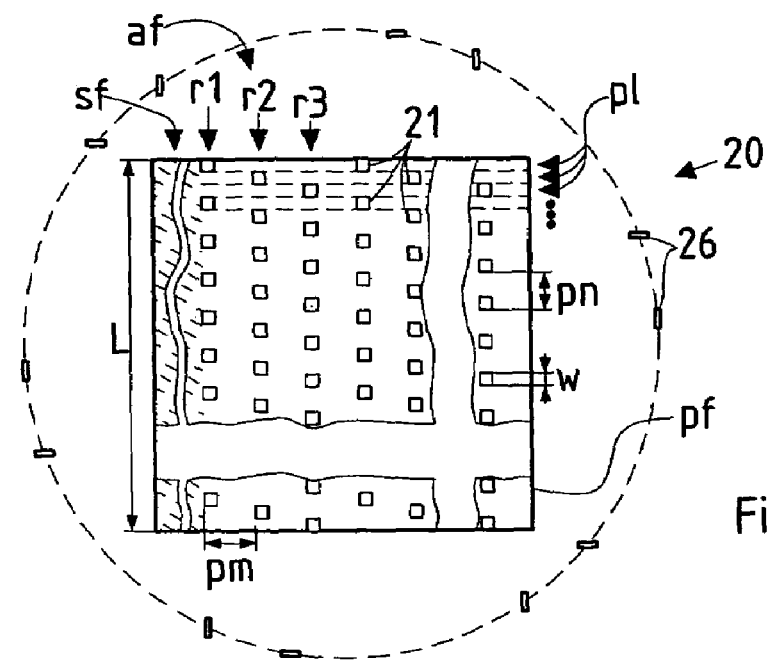
Fig. 3
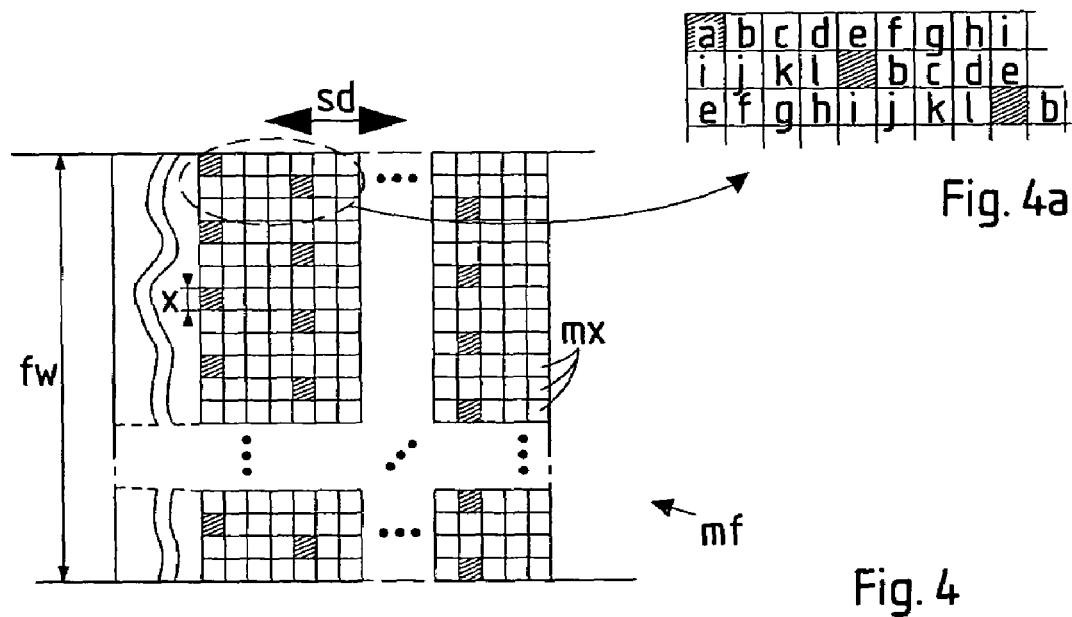
Fig. 4a
Fig. 4

| # of columns ⌀ beam ⌀ column | Exposure Dose | Stage velocity | Stage | Current thru column | total current | Beam on wafer | Wafer throughput |
|---|---|---|---|---|---|---|---|
| 6 x 6 = 36<br>10 mm<br>50 mm | 18 µC/cm² | 0.47 m/s<br>0.21 m/s<br>0.08 m/s | 2 g<br>1 g<br>½ g | 2.1 µA<br>1.00 µA<br>0.38 µA | 76 µA<br>35 µA<br>13.5 µA | 73%<br>83%<br>93% | 15 WPH<br>10 WPH<br>5 WPH |
| 5 x 5 = 25<br>10 mm<br>60 mm | 18 µC/cm² | 0.65 m/s<br>0.33 m/s<br>0.13 m/s | 4 g<br>1½ g<br>½ g | 2.9 µA<br>1.5 µA<br>0.57 µA | 73 µA<br>37 µA<br>14 µA | 75%<br>79%<br>88% | 15 WPH<br>10 WPH<br>5 WPH |
| 4 x 4 = 16<br>15 mm<br>75 mm | 18 µC/cm² | 0.7 m/s<br>0.32 m/s<br>0.12 m/s | 3 g<br>1½ g<br>1 g | 4.7 µA<br>2.2 µA<br>0.83 µA | 76 µA<br>35 µA<br>13 µA | 73%<br>83%<br>94% | 15 WPH<br>10 WPH<br>5 WPH |
| 4 x 4 = 16<br>20 mm<br>75 mm | 18 µC/cm² | 0.46 m/s<br>0.23 m/s<br>0.1 m/s | 2 g<br>1 g<br>½ g | 4.1 µA<br>2.1 µA<br>0.83 µA | 66 µA<br>33 µA<br>13 µA | 80%<br>87%<br>94% | 15 WPH<br>10 WPH<br>5 WPH |
| 3 x 3 = 9<br>20 mm<br>100 mm | 18 µC/cm² | 0.48 m/s<br>0.17 m/s | 1½ g<br>1 g | 4.3 µA<br>1.5 µA | 39 µA<br>13 µA | 77%<br>93% | 10 WPH<br>5 WPH |
| 2 x 2 = 4<br>20 mm<br>150 mm | 18 µC/cm² | 0.90 m/s<br>0.46 m/s<br>0.41 m/s<br>0.38 m/s | 2½ g<br>1g<br>1½ g<br>2½ g | 8.2 µA<br>4.1 µA<br>3.7 µA<br>3.5 µA | 33 µA<br>17 µA<br>15 µA<br>14 µA | 70%<br>77%<br>85%<br>90% | 10 WPH<br>5 WPH<br>5 WPH<br>5 WPH |

Table 1

Fig. 6a

CHARGED-PARTICLE MULTI-BEAM EXPOSURE APPARATUS

CROSS-REFERENCE TO RELATED APPLICATIONS

This application claims the benefit of Austrian Patent Application Serial No. A 1660/2003, filed Oct. 20, 2003.

FIELD OF THE INVENTION AND DESCRIPTION OF PRIOR ART

The invention relates to a charged-particle multi-beam exposure apparatus used for forming a pattern on a surface of a target, such as a semiconductor substrate, by means of a set of beams of energetic electrically charged particles. More in detail, the invention relates to a charged-particle multi-beam exposure apparatus for exposure of a target with a plurality of beams of electrically charged particles, said particle beams propagating along parallel beam paths towards the target; for each of said particle beams an illumination system, a shaping means and a projection optics system are provided, with the illumination system being adapted to produce the beam and form it into a substantially telecentric beam illuminating the shaping means, the shaping means being adapted to form the shape of the illuminating beam into a desired pattern, and the projection optics system being adapted to project an image of the beam shape defined in the shaping means onto the target.

One important application of exposure apparatus of this kind is in the field of particle-beam lithography used in semiconductor technology, as a lithography apparatus. In order to define a desired pattern on a substrate surface, such as a circuit layer to be defined on a silicon wafer, the wafer is covered with a layer of a radiation-sensitive photoresist. Then the desired structure is imaged onto the photoresist by means of a lithography apparatus. The photoresist thus patterned is partially removed according to the pattern defined by the previous exposure step, and is now used as a mask for further structuring processes such as etching. By repeating this scheme, complicated minute structures such as an integrated circuits can be formed.

Multi-beam or multi-column devices of the above kind, in particular multi-beam lithography devices have been addressed several times in the prior art. An early version of a multi-column approach was presented by Nelson Yew in "A Modular System for Electron Beam Microfabrication", Proceedings of Electron and Ion Beam Science and Technology ed. B. Bakish (1974) 111.

Another approach was presented by N. W. Parker et al., "Multicolumn multi-beam (M×M) direct-write electron lithography system", SPIE Vol. 4343 (2000) 811, and E. Yin et al., "Electron optical column for multicolumn, multibeam direct-write electron beam lithography", J. Vac. Sci. Technol. 18 (2000) 3126.

In the articles J. Vac. Sci. Technol. 8 (1990) pp. 1698 and J. Vac. Sci Technol. B 14 (1996) pp. 3774–3781, T. H. P. Chang et al. demonstrate that it is possible to realize a low voltage (about 1 keV) electron beam column as a miniature scanning electron microscope having a lateral dimension of 20 mm. By arranging a plurality of miniature columns of this kind side-by-side it is possible to realize a multibeam lithography system. The tips of the field emission electron sources are imaged 1:1 onto the substrate, thus an appropriate shaping of the individual beams is a necessary requirement with this system.

A multiple electron beam system was proposed by N. Shimazu et al in the article "An Approach to Multiple E-Beam System" of the conference proceedings of the 'International Workshop on High Throughput Charged Particle Lithography', Hawaii, Aug. 11–15, 1997, discussing an electro-optical system with a single electron gun wherein after the cross-over, the beam of the electron gun is split into an array of sub-beams by means of a lens matrix and the cross-over is imaged demagnified onto a wafer by subsequent arrangements of various apertures and objective lenses. A similar concept is realized in the U.S. Pat. No. 5,012,105 of Ando et al.

The GB 2340 991 B of the applicant (assignee) describes an apparatus for multibeam lithography with a common particle source for all beams, a multibeam optical system realized as an electrostatic lens column array; for each sub-beam a deflection unit is provided which is adapted to correct individual imaging aberrations of the respective sub-beam with respect to the desired target position and position the sub-beam during a writing process an the substrate surface.

Another promising development in the field of semiconductor technology is maskless lithography, using an array of blanking apertures in combination with an appropriate movement of the target in order to scan the images of the apertures over the surface of the substrate in a controlled continuous motion, thus achieving a write strategy for exposing the total exposable area of the target.

An apparatus of this kind is, for instance, described in the U.S. Pat. No. 6,768,125 (=GB 0300693.9=JP 2003-45145) of the applicant (assignee). In such an apparatus, a particle beam is generated by an illumination system which produces a homocentric or preferentially telecentric beam of energetic particles. This beam illuminates a pattern definition (PD) means having an array of apertures which can be controlled so as to allow ('switched on') or deactivate ('switched off') the passage of particles of the beam through the respective aperture. The PD device is composed of an aperture array means which has a plurality of apertures of identical shape defining the shape of beamlets permeating said apertures, and a blanking means to switch off the passage of selected beamlets; the aperture and the blanking means are realized as separate plates mounted together at defined distance, for instance in a casing. The beam permeates the blanking aperture array through switched-on apertures, thus forming a patterned particle beam bearing a pattern information as represented by the spatial arrangement of the apertures that are switched on. The patterned beam is then projected by means of a particle-optical projection system onto the substrate where an image of the transparent apertures is thus formed. By means of an appropriate motion of the target under the impinging patterned beam (which itself does not move in space, except possibly for small lateral corrections), the whole image is moved over the surface of the target so as to cover the total area of the substrate surface.

The throughput of an exposure apparatus in lithography based on charged particle optical systems is limited by the maximum current for a given resolution node (the term lithography node refers to specifications for the exposure, in particular the critical dimension and the minimum feature size, defined by the semiconductor industry in terms of roadmaps). Typical electron beam currents required for 10 wafers per hour (WPH) based on 300 mm wafers with 18 µC resist exposure dose at the 45 nm node would be between 10 to 20 µA. For the 32 and 22 nm node, which will be required around 2010 by the chip foundries, more current by a factor of 2 (for the 32 nm node) and 4 (for the 22 nm node) will be needed to hold the node at same throughput because of the need to have a statistically relevant amount of particles in each exposure spot to prevent shot noise, i.e. single particle interaction effects playing a role for resolution and line edge roughness. The fundamental current limitation with respect to current in charged particle optical systems results from the Coulomb interaction of the particles along the trajectory, leading to the so-called stochastic blur contribution in the image, and in a second consequence, leading to space charge related distortions of the image and defocusing effects. Therefore, only a certain density of charged particles is acceptable in the column at a time, the density directly related to the velocity of the particle and the overall current.

There are several possibilities to enhance the maximum current through a column at the same resolution, for example, to shorten the column by reducing the focal lengths, or to use higher beam energy. Both of these approaches are commonly used and exhausted as regards the maximum possible electrostatic field strengths in electrostatic imaging systems and equivalently to the maximum possible magnetic saturation in magnetic imaging systems. Other approaches include beam control devices in order to distribute the current density in regions where the space charge reaches maximum values, i.e. around crossovers, by producing an aberrated beam in these areas corrected in a subsequent section of the optical system. Another possibility is the use of a large field projection approach, allowing currents which are comparably much larger than in case of focused beam systems for the same resolution. To the knowledge of the applicant(s), no solution has been found so far which allows to shift the upper current limit for a given lithography node to a level to be in agreement with the lithography roadmaps (Int. Sematech, http://www.sematech.org). In known charged particle systems the possible current through the column remains limited due to Coulomb interaction between the particles used for the beam.

A promising way to circumvent the above-described throughput problem for charged particle optical systems applicable for high throughput lithography is to use two or more parallel columns writing, at the same time, on the same wafer in a multi-beam system. Although the idea has been described by several publications is this field as described in the beginning, none of the proposed multi-beam systems has been successful until now. The reason why none of the prior concepts has eventually been realized to practice is that the scanning strategies proposed so far were either not sufficiently efficient, or involved other major deficiencies (such as deficiencies with respect to reliability and electromechanical integrability).

While the space charge problem can be circumvented by using many parallel columns, the main technical challenges of multi-beam systems are connected with issues to meet specifications required with the industrial standards, such as:
1. the reliability of the charged particle beam source (or sources, as the case may be, in particular in the case of one source per column),
2. the required homogeneity of the beams (across the exposure latitude),
3. the alignment of the beams,
4. the requires stability including wafer heating and magnetic disturbance,
5. the required data rates for pattern generation,
6. the required resolution,
7. the required absence of image distortion,
8. the required reliability with respect to contamination issues,
9. the desired extendibility towards higher exposure doses and lower feature sizes.

Due to these problems the prior art multi-beam lithography systems could not offer a complete solution for a functional and reliable lithography tool. Therefore, maskless lithography based on charged particles is currently restricted to low-volume production, for example the fabrication of ASIC's and prototype circuits by conventional e-beam writers, and has not yet been introduced to application fields where lithography with more than 10 WPH are targeted.

SUMMARY OF THE INVENTION

In view of the above-described problems, it is the aim of the invention to offer a multi-beam tool setup and an exposure strategy capable for high throughput, of at least 10 WPH.

This aim is met by an apparatus as described in the beginning, wherein the shaping means of each particle beam is realized as a device for defining a multitude of beam-lets in the respective particle beam, said device being adapted to let pass the illuminating beam only through a plurality of apertures defining the shape of beamlets permeating said apertures, said device further comprising a blanking means to switch off the passage of selected beamlets from the respective paths of the beamlets, wherein the illuminating system and/or the projection optics system comprise particle-optical lenses having lens elements which are, at least with respect to mounting and/or voltage supply, common to more than one particle beam.

The basic idea of the present invention is to use several columns of a maskless particle-beam exposure apparatus, preferably of the kind as described in the U.S. Pat. No. 6,768,125, adapted to work in parallel on the same wafer in order to increase the throughput. As already explained, in the apparatus of the U.S. Pat. No. 6,768,125, a scanning stripe exposure technique is used for wafer exposures, the tool setup basically comprising a particle source, a charged particle projection system, realized by one optical column, and a dynamically generated image, transferred to a substrate at large demagnification. However, it should be appreciated that the apparatus disclosed in the U.S. Pat. No. 6,768,125 is not, as such, suitable for use in a multi-beam device; rather an modification is necessary. The modification comprises, in particular, the provision of common lens elements, as well as possibly further modifications, such as means for a reduced diameter of the columns, and an adapted wafer scanning strategy. The writing fields of each column do not overlap, so that each column exposes separate subfields of 1/N area of the wafer, assuming N columns distributed regularly over the square-shaped area circumscribed around the wafer area. Thus, according to the invention several columns are working in parallel, realizing what may be called multiple scanning stripe exposure approach, bringing about unique advantages with respect to performance, reliability and tool fabrication costs, and avoiding physical limitations of charged particle optical systems based on single columns. It is emphasized that due to the unavoidable mechanical limitations of scanning stage systems, in particular of the stage velocity and acceleration (upper limits will be about 1–2 m/s and 30–40 m/s$^2$, respectively) as well as jerk, in the high throughput regime, e.g. above 20 WPH, productivity is increased much faster than in a linear manner with the number of columns. The reason for this is that the total turn-around time (which is dead exposure time for the throughput) is significantly reduced with lower scanning speeds, achieved by the parallel use of several columns, at same acceleration and jerk.

In particular, the risk connected to the source reliability scales with the number of sources if each source is needed for writing the full pattern. Therefore, the number of sources should be kept low. In case of multiple scanning stripe exposure the risk connected to source reliability is largely reduced, as each column writes independently on one subfield (based on the total field being divided into a corresponding number of subfields), the subfield preferably comprising an integer number of chips, reducing the risk connected to the source to a factor of 1/N (where N is the number of independent columns).

The total current available for exposure, and in particular the current per column, will be chosen as high as possible for maximum throughput. This can be achieved by using a projection system in which the pattern is dynamically generated, as in the U.S. Pat. No. 6,768,125, where a multitude (i.e., typically, in the range of several hundred to hundred thousand) of beamlets are switched on and off in parallel inside one column. The pixel rate per column is, therefore, limited only by the total current due to the plurality of beams, typically 1 to 10 μA per column depending on the length of the columns and the energy of the particles. For comparison, according to the state of the art, the pixel rate per column would be significantly limited by the brightness of the source and the blanking rate, since the state of the art envisages either single aperture projection or single or shaped beam direct write, or a comparable small number of blanked beams per column (smaller than 1000). The reason for the difference in the number of beams per column lies in the very large (e.g. 200×) reduction factor of the projection system used by virtue of the invention, which makes the MEMS (micro-electro-mechanical-system) fabrication of the PD feasible with available technology.

According to an advantageous variant of the invention the common lens elements may be realized individual lens elements provided for each of the particle beams and connected to a unique electrical supply. The common lens elements may also be realized by a common structural member surrounding each of the particle beams enhancing stability of the resulting structure.

Furthermore, the particle-optical lenses of the illuminating system and the projection optics system may comprise lens elements common to more than one particle beam as well as lens elements which are individual to one particle beam respectively and connected to individual electrical supplies. In particular, the particle-optical lenses of the illuminating system and the projection optics system comprise electrostatic lenses which are common to multiple particle beams as well as electrostatic lens elements which are individual to one particle beam respectively for introducing individual corrections of the effect of the common electrostatic lenses.

In a variant of the invention which simplifies manufacturing the device, the apertures in the pattern definition means have identical shapes. Alternatively, the apertures in the pattern definition means may have shapes which produce images of identical shape on the target, so as to allow the pattern on the image to be composed of uniform elementary pixels, regardless of the relative position of the pattern on the target.

In another advantageous development of the invention, the projection system comprises three or more focusing elements realizing reducing projection optics having two consecutive cross-overs. A reduction optics allows a pattern to be generated with very small feature sizes at the target.

In another preferred aspect of the invention, the projection lens system has 4 lenses realizing a 2-stage reduction system, in which parts of the beam are used for beam adjustment and beam analysis at the position of the intermediate image, located between the first and second crossover. Furthermore, the target stage may be adapted to move the target under the multiple beams according to a predefined scanning motion according to which the beams cover the total area of the target to be exposed in the course of the exposure process. In this case, the target stage may also be adapted to perform a scanning motion according to which each beam covers the total area of a sub-field of the target, with the sub-fields altogether totaling to the total area of the target to be exposed, and/or the sub-fields of the beams covering separate parts of the total area of the target to be exposed. Moreover, a scanning motion may be performed wherein each beam covers the total area of a sub-field of the target in a single pass scanning stripe exposure pattern.

In order to enhance the autonomy of the beams and facilitate generation of complex patterns a PD means may be provided for each particle beam, where the PD means has a pattern field in which the apertures are located, said pattern field having a length of at least 500 times the size of the apertures. Likewise, for each particle beam a pattern definition means may be provided with at least 20000 apertures whose transparency to the particle beam can be electronically controlled between switched on and off states.

An advantageous layout of the device realizes an electrostatic lens having an electrode column realized as a series of at least 3 electrodes of substantially equal shape of substantially rotational symmetry surrounding the respective beam path, with said electrodes being arranged in consecutive order coaxially along an optical axis representing the center of the beam path and said electrodes being provided with electric supplies for feeding different electrostatic potentials to the respective electrodes. This layout facilitates shielding out unwanted magnetic and electromagnetic fields from the beams.

In this case, a suitable choice of the outer radius of all electrodes of the electrostatic lens is not larger than 5 times the largest radius of said particle beam path within the lens. In order to further enhance magnetic shielding, the electrodes of the electrode column are at least partially made from a soft-magnetic material having at environmental conditions a permeability greater than 100, preferably 300. (Values of permeability in this disclosure refer to relative permeability in SI units.) Advantageously, the magnetic shielding is provided by an additional magnetic shielding tube made from a soft-magnetic material surrounding the electrode column and extending along the direction of the optical axis at least over the length of the electrode column.

A suitable shaping of the electrodes of the electrode column(s) is obtained by if the outer portions of the electrodes have corresponding opposing surfaces facing toward the next and previous electrodes, respectively. For instance, beside an outer member ring as mentioned an inner member ring may be present with a circular edge directed toward the optical axis. While the outer part serves to shield out unwanted fields, the inner part serves to shape the electrostatic field inside the lens. Moreover, in order to avoid secondary-electron effects, the inner member ring may be provided with a concave surface extending outward from the circular edge and facing toward the direction from where the charged particles enter the electrode column.

BRIEF DESCRIPTION OF THE DRAWINGS

In the following, the present invention is described in more detail with reference to the drawings, which show:

FIG. 3 shows a plan view of the aperture arrangement in the pattern definition device used in the apparatus of FIG. 1, FIG. 4 shows an image field as present on a substrate surface, FIG. 6a is a Table showing an overview of possible arrangements of columns with corresponding throughputs.

DETAILED DESCRIPTION OF THE INVENTION

Figure 1:
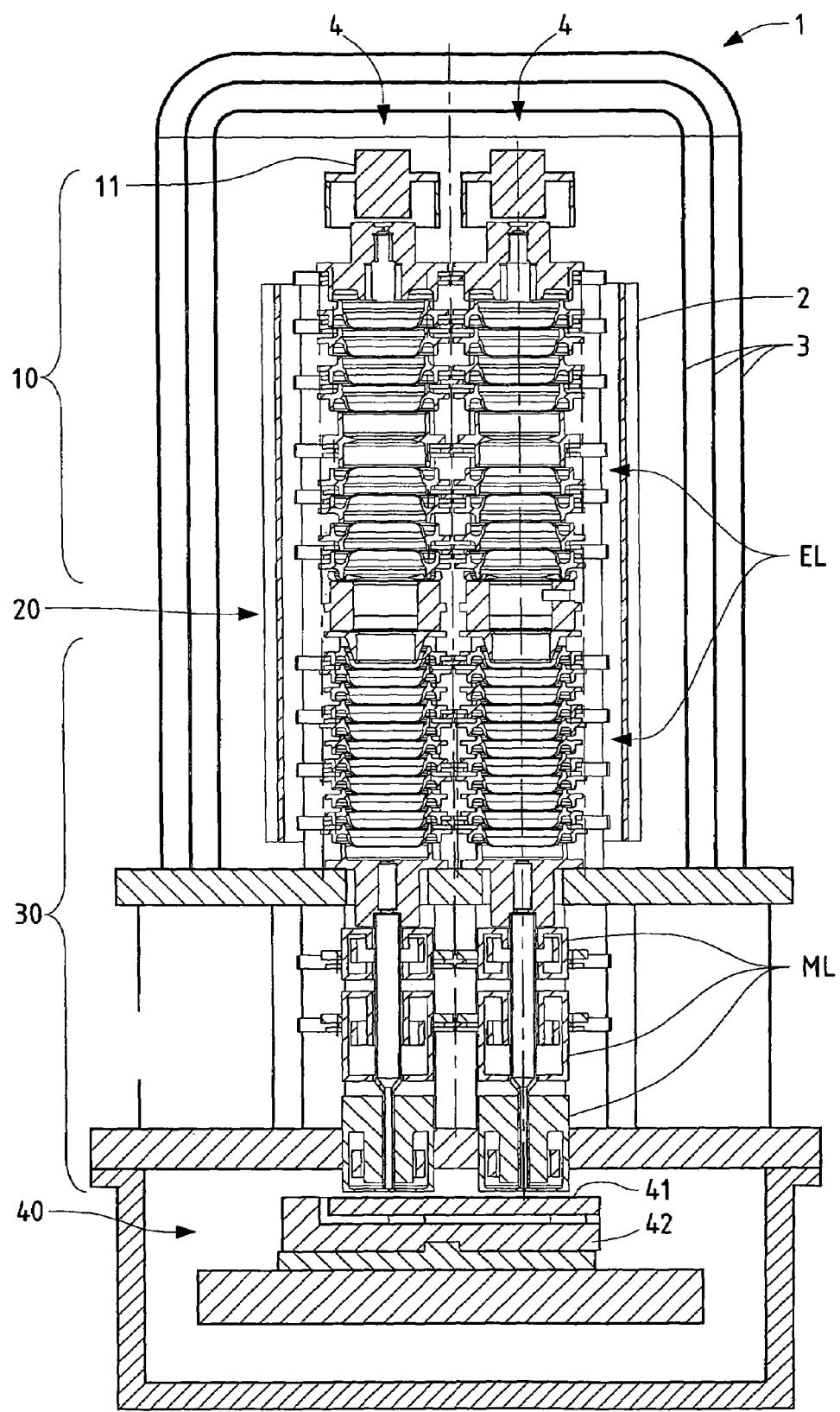
FIG. 1 shows a multibeam apparatus according to an embodiment of the invention.
Figure 2:
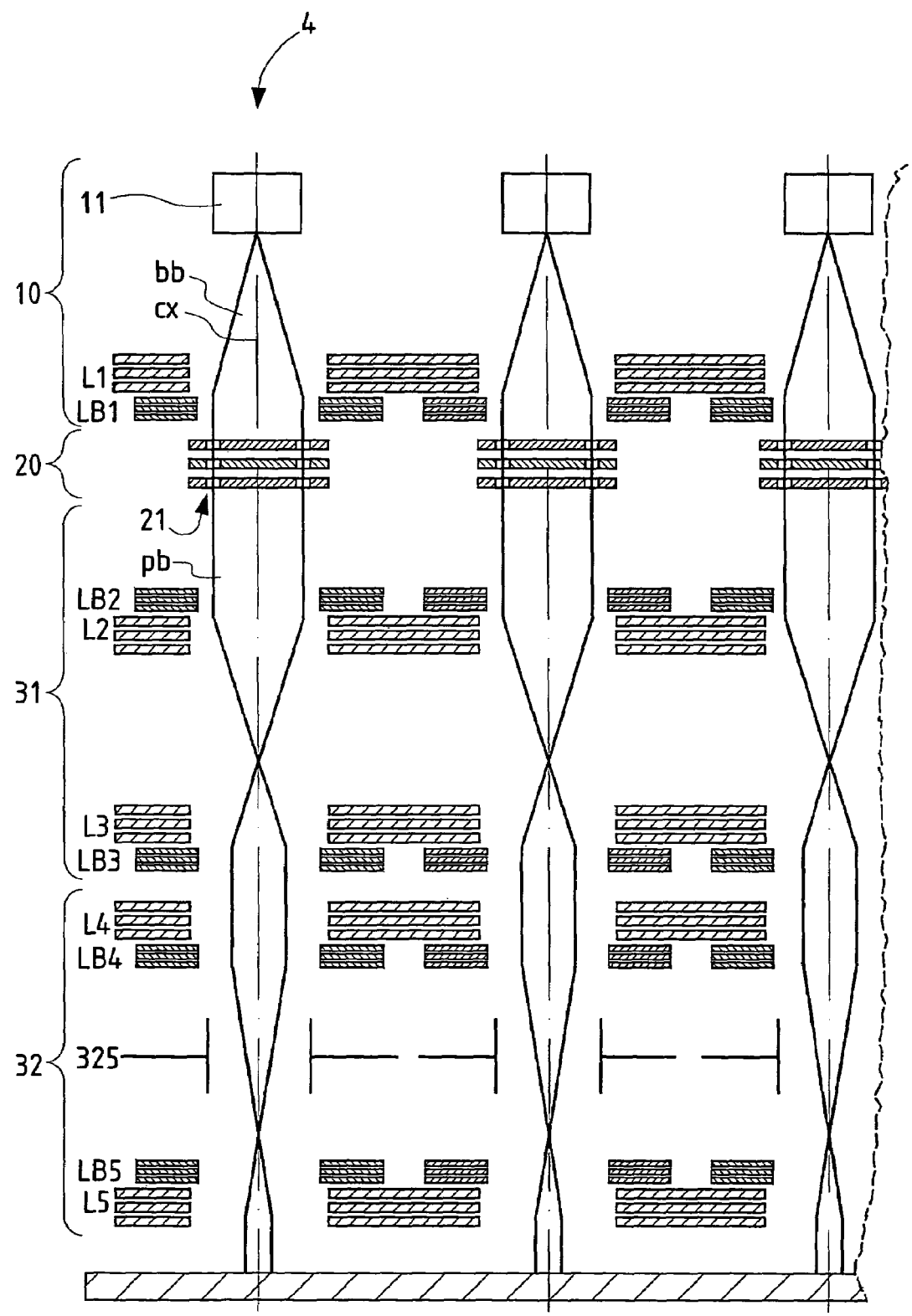
FIG. 2 shows a schematic overview of the elements of the apparatus of FIG. 1.

A preferred embodiment of the invention is shown in FIG. 1. Four columns are combined in a 2×2 arrangement of a multicolumn apparatus 1 for exposing a wafer held in the target chamber representing the bottom of the apparatus. The longitudinal section of FIG. 1 runs through two neighboring columns 4. FIG. 2 shows a schematic longitudinal-section view illustrating the basic elements of the device of FIG. 1. (For the sake of clarity, the columns are shown in FIG. 2 as if they were arranged in a single plane.)

Major improvements of the embodiment over the prior art are, for example, that it offers a large redundancy in the pattern generation process on the one side, and an avoidance of alignment problems between different columns on the other side. It represents a novel implementation of multi-column and multi-beam (per column) approach, based on the above-mentioned U.S. Pat. No. 6,768,125. Furthermore, it allows to partially reduce or even circumvent technical risk issues in all sub-systems, particularly concerning electron source, reduction system, thermal issues, MEMS blankers/IC, alignment, distortion, contamination issues, data rate, redundancy, stage/electrostatic scanning, throughput, overlay, Z-margin (depth of focus).

The principles of a maskless particle-beam exposure apparatus are discussed in the U.S. Pat. No. 6,768,125 which is included by reference into this disclosure; those features of the apparatus of FIGS. 1 and 2 that are beyond the scope of the U.S. Pat. No. 6,768,125 are discussed in the following, and only those details are given as needed to disclose the invention; for the sake of clarity, the components are not shown to size in FIG. 2. It should be appreciated that the invention is not restricted to the embodiment discussed in the following, which merely represents one of the possible implementations of the invention.

The main components of the lithography apparatus 1 are—corresponding to the direction of the lithography beams cb which run vertically downward in FIGS. 1 and 2—an illumination system 10, a PD system 20, a projecting system 30, and a target station 40 with the substrate 41. The whole apparatus 1 is contained in a vacuum housing 2 held at high vacuum to ensure an unimpeded propagation of the beams cb along their respective optical axes cx in each of the columns 4. Around the vacuum housing 2, multiple magnetic shields 3 are provided around the electrostatic lens part of the apparatus, in order to rule out the influence of external magnetic fields.

In order to avoid contamination of the surfaces in the PD device (which may be induced by, for example, beam-induced deposition of organic materials) the vacuum in the neighborhood of the PD device is kept preferably at UHV conditions or close to it. Further, the whole PD device is mounted in such a way that it can be serviced periodically by dismounting the plates without breaking the alignment of the other critical column components. (For the sake of simplicity the mechanical devices for changing the PD device are not shown in the drawings).

For the sake of simplicity the data path from the outside to the individual PD devices is not shown in the drawings. Optical means, for example fiber optics arrays combined with photo detectors, may be used to transfer high data rates; such equipment is well known from prior art, in particular communication technology. It shall be mentioned, that the optical rays inside the multi-column array can be guided by fibers, placed between common plates held at low or zero potential difference, or, if projected through free space, also between plates held at a high potential difference. The data transfer can be done also along the direction parallel to the columns, where enough space is available in the rectangular arrangement of the columns.

The particle-optical systems 10, 30 are realized using electrostatic or electromagnetic lenses. With increasing column density the use of electrostatic lenses becomes more favorable since, firstly, the feasible outer diameter of electrostatic lenses can be scaled to lower values without significant change of the focus power and aberration coefficients (see for example FIG. 10). Secondly, due to the availability of common electrode elements, a plurality of electrostatic columns are favorable compared to magnetic lenses, because magnetic coils cannot be fed as simply as the electrostatic lenses using common electrodes and common potentials. Similar arguments apply for cooling the unavoidable power dissipation of a large number of coils, which is not present in the electrostatic case. Due to the low column diameter, the use of electrostatic lenses also allows more effective shielding of electrostatic and magnetic interference fields.

Referring in particular to the cut-open column 4 in FIG. 1, the illumination system 10 comprises, for instance, an electron gun 11 with an extraction system as well as a condenser lens system realized as a multi-electrode column as explained further below with reference to FIG. 10.

As mentioned, the apparatus 1 employs electrons as charged particles. It should, however, be noted that in place of electrons, in general, other electrically charged particles can be used as well, which would then be provided by an appropriate ion source, for instance, for hydrogen ions or heavier ions.

The extraction system accelerates the particles to a defined energy of typically several keV, e.g. 10 keV. By means of the condenser lens system, the particles emitted from the source 11 are formed into a wide, substantially telecentric particle beam serving as lithography beam. The beam irradiates a PD device 20 which, together with the devices needed to keep its position, form a PD system. The PD device 20 is held at a specific position in the path of the lithography beam lb, which thus irradiates a plurality of apertures 21. Some of the apertures are "switched on" or "open" so as to be transparent to the incident beam; the other apertures are "switched off" or "closed", i.e. non-transparent (opaque) to the beam. The pattern of switched-on apertures is chosen according to the pattern to be exposed on the substrate, as these apertures are the only portions of the PD device transparent to the beam, which is thus formed into a patterned beam pb emerging from the apertures.

The pattern as represented by the patterned beam pb is then projected by means of an electro-magneto-optical projection system 30 onto the substrate 41 where it forms an image of the switched-on mask apertures. The projection system 30 implements a demagnification of, for instance, 200× with two crossovers c1, c2. The substrate 41 is, for instance, a silicon wafer covered with a photo-resist layer. The wafer 41 is held and positioned by a wafer stage 42 of the target station 40. The alignment of the beams of the columns 4 with respect to each other and the wafer is done by means of an alignment system 60 discussed in detail below with reference to FIG. 6.

In the embodiment of the invention shown in FIGS. 1 and 2, the projection system 30 is composed of two consecutive electro-magneto-optical projector stages 31, 32. The lenses used to realize the projectors 31, 32 are shown in FIG. 2 in symbolic form only, as technical realizations of particle imaging systems are well known in the prior art, such as, for instance, the U.S. Pat. No. 4,985,634 (=EP 0 344 646) of the applicant (assignee). The first projector stage 31 images the plane of the apertures of the device 20 into an intermediate plane which in turn is imaged onto the substrate surface by means of the second projector stage 32. In the intermediate plane the beam is substantially telecentric as it is at the position of the PD device. Both stages 31, 32 employ a demagnifying imaging through crossovers c1, c2. The demagnification factor is about 14× for both stages, resulting in an overall demagnification of 200×. A demagnification of this order is in particular suitable with a lithography setup, in order to alleviate problems of miniaturization in the PD device.

In both projector stages the respective lens system is well compensated with respect to chromatic and geometric aberrations; furthermore, a residual chromatic aberration of the first stage 31 can be compensated by suitable fine correction of the electrode potentials in the second stage 32.

As a means to shift the image laterally as a whole, i.e. along a direction perpendicular to the optical axis cx, deflection means 325 are provided in one or both of the projector stages (in FIG. 2 only shown for the second stage 32). The deflection means can be realized as, for instance, a multipole electrode system which is either positioned near to a crossover, as shown in FIG. 2, or after the final lens of the respective projector. In this apparatus, a multipole electrode is used as deflection means both for shifting the image in relation to the stage motion and for correction of the imaging system in conjunction with the alignment system.

FIG. 3 shows a plan view of the arrangement of apertures in the PD device 20. A plurality of square-shaped apertures 21 is provided which are arranged within a PD field pf in a regular array in which the apertures 21 are aligned along adjacent lines p1, wherein in each of the lines p1 the same number of apertures is present. Seen along the direction perpendicular to the lines p1, the apertures form a sequence of rows r1, r2, r3; in the embodiment shown, the rows r1–r3 are not adjacent but spaced apart. The apertures are arranged in aperture fields af according to a skewed regular arrangement such that the apertures of every third row align (n=3) as the pitch pn between neighboring rows is three times the width w of an aperture (i.e., pn=n×w), and the offset pm between neighboring rows is 4 times the width of an aperture (i.e., pm=m×w with m=4). Within a line pl, the offset of apertures is n·pm=12. Thus, the apertures cover only 1/(n× m)=1/12 of the area of the field pf and, at a time, only one out of n×m=12 image elements can be exposed as shown in FIG. 4; the other elements are exposed in subsequent steps by means of moving the substrate along the "scanning direction" sd relative to the image of the apertures.

FIG. 4 illustrates the image field mf produced on the substrate; for the sake of clarity it is assumed that all apertures are switched on in this figure. The width fw of the image field is the width L of the PD field pf reduced by the demagnification factor of the projection system. The image field is composed of a plurality of image elements mx (also referred to as pixels). For a given position of the image field on the substrate, each of the apertures 21 of the aperture array corresponds to an image element mx, but as the apertures only cover a fraction of the PD field area, only a corresponding fraction of the number of image elements (shown hatched in FIG. 4) can be exposed at a time. In order to expose also the other image elements, the substrate is moved under the beam so as to shift the image field on the substrate. FIG. 4a illustrates the exposure of pixels in subsequent positions of the motion of the substrate through the possible 12 (=n×m) positions; the pixels are accordingly referenced with letters a to l (the pixels shown hatched are position a). The whole image field mf is moved over the surface of the photoresist-covered wafer serving as substrate 41 so as to cover the total area of the substrate surface. In the example discussed here, the minimum feature size shall be 50 nm, and the smallest spot to be illuminated on the wafer, here defined as the pixel width x, is 25 nm. The image field width fw is 100 μm; in order to produce this image field in connection with a 200× demagnification projection system (see above), the square-shaped PD field has a width L=20 mm. Consequently the number of lines pl is L/w=4000, and 4000 bit streams are to be addressed by the incoming data stream. The incoming data stream is composed by 4000 bits times the color depth for each pixel, with the color depth typically 6 bit (for 64 gray scale steps). In the direction across, there are fw/(n·x)=L/(n·w)=1333 apertures in each of the rows r1–r3.

The blanking of the beamlets is controlled by means of a blanking means realized as a blanking plate comprising an array of openings, each corresponding to an aperture, in a blanking field corresponding to the PD field pf. Each opening comprises a set of beam blanking electrodes, serving as deflection plates to deflect a beamlet of its path when it is not to reach the target ('blanking'). The blanking means may further comprise additional plates for shielding the electrostatic fields of neighboring blankers. More details about the layout of the blanking and the pertinent circuitry can be found in the U.S. Pat. No. 6,768,125.

According to the invention the PD field pf of each of the columns 4 is imaged onto the target 41, where an image of the PD field is produced—more exactly, of the switched-on apertures. Thus, four image fields (or, in general, a number corresponding to the number of columns) are produced at a time on the wafer.

It should be noted that, in general, the minimum number of apertures in the PD field pf appears to be in the order of ten thousand, usually more than 20000. For, in a likely layout, there are at least 64 per line pl times the number of lines, i.e. 64*1024=65536 apertures for a 5.12×5.12 mm plate with a fractional count $1(n*m)=1/16$ at apertures of 5 μm, whose transparency to the particle beam can be electronically controlled between switched on and off states. This number is necessary to produce at least 64 gray scales on the substrate, which is considered a requirement for semiconductor application.

Furthermore, in the present embodiment, the apertures 21 have identical shape. In a more general layout, the aperture shape could vary, adapted to meet specific requirements. For instance, the apertures near to the edge of the field pf, or selected apertures to realize specific gray values, may have a greater or smaller size. This may be useful, for instance, in order to compensate for a possible dose inhomogeneity across the field pf.

Figure 5:
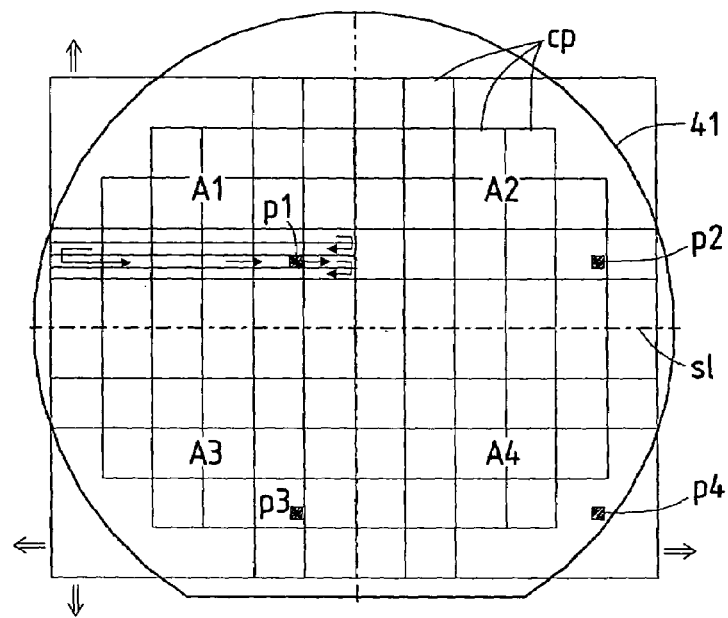
FIG. 5 shows the areas of a wafer written by the columns of the apparatus of FIG. 1.

FIG. 5 shows an example of a snapshot plan view of the wafer 41 serving as target with the four image fields p1, p2, p3, p4. As will be clear from the above discussion, the image fields p1–p4 move along lines running horizontal in FIG. 5 across the wafer, due to an appropriate movement of the wafer stage In FIG. 5, the wafer stage is assumed to move the wafer from right to left, so with reference to the wafer, the image field p1–p4 appear to wander from the left to the right across the wafer surface. (In the temporary situation of FIG. 5, the image field p4 has just wandered off the wafer.) When one line is finished, the wafer is stepped in the perpendicular direction to the next line, which is then exposed, and so on until the whole wafer area is exposed. The columns 4 are allotted to areas A1, A2, A3, A4 of equal shape and size on the wafer surface, and the image fields p1–p4 move only within the respective areas A1–A4. Thus each of the image fields only covers only a corresponding part of the total surface of the target 41 to be exposed. In the specific example of the embodiment shown with four columns, this means, that the wafer stage movement only extends to half of the wafer size in both lateral directions. It is important to note that for a given number of columns the positions of the individual columns may be optimized for the maximum throughput, and particularly for the chip dimensions. No regular arrangement of the columns is needed provided the allotted areas cover the whole wafer area to be addressed by the scanning process. If, for instance, a larger stage motion along the scanning direction is accepted, the distance of the columns along this direction may be increased. On the other hand, overlapping sub-fields do mean over-exposures, considering the intersecting areas appropriately in the data preparation and timing. The high flexibility in the choice of the column positions will favor the acceptance of the tool according to the invention in the industry.

It should be appreciated that each of the image fields p1–p4 comprises a considerable number of beamlets producing each a pixel image on the target. The high number of pixels per column is essential to realize the "multiple scanning stripe exposure" writing strategy where each column addresses 100% of the pattern information within a sub-field of the wafer. This is especially true as gray scaling, required by lithography with small address grid, is done by multiple exposures by beamlets positioned in line inside a single column image field. Another reason why a large number of beams is required for each column is the need of high redundancy, which leads to a significant increase of the reliability of the maskless lithography process. It should be mentioned that the overlay of single pixel exposures generated by different columns in an multi-column arrangement would require extremely high stability and alignment precision. Therefore, the strategy preferred with the invention is to write all pixels (including, if applicable, gray scales and writing of redundant pixels) by means of one column using a most advantageous single pass scanning strategy (single pass means that every stripe is scanned only once, where 100% of the pattern is transferred). This entails a lower limit for the column diameter, as the size of the aperture plate system has to be at least the product of the distance between apertures in scan direction times the number of gray scales. If redundancy is desired, more than one aperture per gray level is needed. Typical values would be 2 apertures for each gray scale on a 10 mm square size aperture plate with 5 μm apertures and 1/16 density of apertures on the plate.

An important aspect for the proper operation of multibeam systems is the beam-to-beam alignment, i.e. the relative image placement of the columns with respect to each other. In case of the present invention the beam-to-beam alignment is less crucial than in systems where several beams write on one chip, all the more when the stitching line s1 (FIG. 5) between the areas A1, A2, . . . can be chosen in such a way that it lies in the regions between the chip fields cp, for example on the so-called scribe-line. However, for the so-called Mix-and-Match processing, where the wafer is exposed by different exposure tools, each tool having individual magnification and placement errors, it is necessary to know the absolute alignment of each column with respect to wafer alignment marks to compensate the errors is the previously processed layers.

Figure 6:
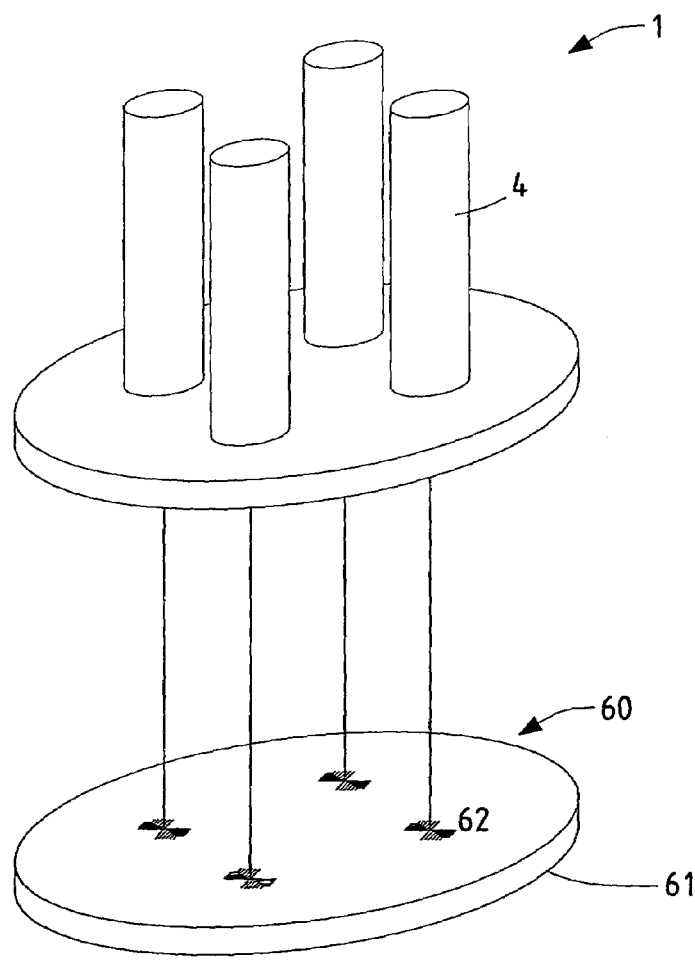
FIG. 6 shows in a schematic view the column alignment.

One possibility to adjust the beam-to-beam alignment of the beams generated by the individual columns is discussed in the following with reference to FIG. 6. The beam-to-beam alignment is based on the use of 1) a target chuck 61 with alignment marks 62, at least one alignment mark for each column,
2) electronic test patterns,
3) a scanning device 325 allowing to scan a test pattern over the alignment marks in order to determine the position of best match, and
4) a secondary electron (SE) detector with very high time resolution, as discussed in the following; further details about alignment systems can be found in the U.S. Pat. No. 4,967,088 of the applicant (assignee). The SE detector (not shown in FIG. 6) can be either on the alignment plate, on the exit aperture of the column of even inside the column, just like in a secondary electron microscope. The exit plate is the preferred place.

vThe determination of the beam-to-beam position is realized by a chuck comprising two-dimensional nanostructured alignment marks. The chuck is preferably made from Zerodur or another material with a very low thermal expansion coefficient, in order to fulfill the required thermal stability. The alignment marks may be structured either directly into the Zerodur material or on a different material substrate which is bonded or deposited to the Zerodur chuck.

The patterns of the alignment marks may consist, for example, of lines and spaces with selected spacing in two angular domains, so that the position with respect to the projected beam can be measured by shifting an electronically generated test pattern over the alignment marks, the test pattern having a strong correlation to the alignment mark pattern. One possible structure of the test pattern would be the pattern of the alignment marks folded with the demagnified image of the aperture plate (with all apertures switched on), so that the test pattern, which is then the aperture plate image logically connected with an AND to the lines and spaces pattern, would contain intensity contributions of single apertures along the lines of the alignment mark pattern, and no intensity nothing in between. Time-resolved measurement of the SE signal will give a sharp maximum only if the test pattern is placed at same place then the alignment mark pattern.

The position detection is done by scanning of the image in two directions, optimizing the position of best image correlation (maximum SE signal). The shifting of the image along the scanning direction can be achieved by means of the aperture plate system itself, just like in a regular exposure mode but with the substrate in stable position, or by the column deflector plates, or both. The 2D correlation function is then given by the integrated SE signal.

To increase the SE contrast, either scanning of the whole image field by deflector plates into the inverse direction with respect to the motion of the projected image, i.e. relative slowing down of the speed of the image on the wafer, or a reduced toggling frequency in the aperture plate system can be used. The former may lead to a one-dimensional distortion of the geometric images of the apertures along the scanning direction, which can be easily compensated by the data preparation.

The nanostructured alignment marks may be affected by a topographical or chemical surface contrast, the feature sizes depending on the resolution required in the range of 5 nm–100 nm. Methods to produce the required high precision structures may be for example focused ion beam etching and deposition, or lithographical based silicon technology processes.

Adjustment of the column image plane and magnification with the desired position is also necessary. The adjustment of the Z-position (position measured along the optical axis) of the image plane, magnification and to some extent also image distortion, is done equivalently to the alignment procedure, using alignment marks with particular sensitivity. For focus and distortion adjustment one could use a plurality of very small dots with sizes in the range of the smallest geometric spot size. For magnification measurement one can use patterns where the correlation structures are concentrated to the outer regions of the image field, where the magnification error is a maximum. The image plane variation will usually be mapped before exposure and/or dynamically measured during exposure.

The means and procedure described above can be used also to perform a calibration of the optical projection system with respect to magnification and image Z-position (image plane) variation, the optical projection system comprising a unit for large reduction and a device such as the aperture plate system in the PD device.

Another aspect of alignment is that of wafer alignment. The wafer alignment marks can be either optical alignment marks or e-beam detected alignment marks. The alignment of the wafer with respect to the optical reference planes is done the same way as in comparable exposure tools by detecting the alignment marks placed directly on the wafer. During the scanning process, alignment is held by detecting alignment marks on the wafer and/or alignment marks on the wafer chuck, ensuring that the beam is tracked with respect to the actual position of the wafer.

Another aspect concerning the productivity of a multi-beam tool consisting of parallel optical columns comes from the final resolution. According to the usual definition, the final resolution is the total blur in full width half maximum of the dose distribution. In literature there are somewhat controversial results on the importance of the stochastic blur contribution and how much current can be used in projection systems for a certain node. As mentioned above, the current can be maximized by optimizing the column geometry and the beam energy. Generally, a current in the range up to about 25 μA for the 45 nm node would be possible considering only the importance of the stochastic Coulomb interaction. However, if also global space charge effects—which are particularly current dependent and thus pattern dependent—are considered, the effect of image distortion and de-focusing has to be considered at high beam currents. In principle, these effects could be corrected by distortion correction means and dynamic focusing. However, to avoid large efforts and to reduce risks connected to space charge effects, for the present invention not the ultimately high currents per column are targeted, but, depending on the node and the realization of the optical system, currents between 500 nA and 3–5 μA per column are of particular interest. For such currents a dense packaging of columns on the footprint of a 300 mm wafer is possible using available fabrication technology.

By virtue of the invention the throughput is basically a function of the number of columns, the current per column and the stripe width (i.e., the width of the stripes which are exposed by one column). The stripe width is directly related to the throughput, as it is implicitly included in the total turn-around time of the stage. The total turn around time reduces the throughput as during turn around no exposure of the wafer is possible. For 2×2 columns in square arrangement placed at 150 mm column to column distance, 200× reduction optics achieving 100 μm stripe width and 4.1 μA current per column, a throughput of 5 WPH at 45 nm node can be achieved. The corresponding stage parameters are 0.46 cm/s velocity, 11.1 m/s$^2$ acceleration and 668 m/s$^3$ jerk. Half of the stripe width at same current per column would require a 40 m/s$^2$ stage acceleration, which is technically much more demanding. An overview of the possible arrangements and the corresponding throughputs is given in Table 1.

It is one of the major advantages of the invention that "additional parameters" are introduced for optimizing the set of critical parameters, namely the number of columns, the critical parameters including the source brightness, the stage velocity, acceleration and jerk, and the current per column. Only due to the chosen multiple scanning exposure strategy, it is possible to significantly reduce one parameter by increasing another, or in other words, to compensate the risk connected with one parameter by another parameter.

For instance, to relax the stage requirements, which is one bottleneck in scanning exposure systems, one can increase the column number, if necessary, to about 100 (this number may be the densest arrangement of projection columns feasible with 200× reduction

TABLE 1

FIG. 6a

| #of columns Ø beam Ø column | Exposure Dose | Stage velocity | Stage | Current thru column | total current | Beam on wafer | Wafer throughput |
|---|---|---|---|---|---|---|---|
| 6 × 6 = 36 | 18 | 0.47 m/s | 2 g | 2.1 µA | 76 µA | 73% | 15 WPH |
| 10 mm | µC/cm² | 0.21 m/s | 1 g | 1.00 µA | 35 µA | 83% | 10 WPH |
| 50 mm | | 0.08 m/s | ½ g | 0.38 µA | 13.5 µA | 93% | 5 WPH |
| 5 × 5 = 25 | 18 | 0.65 m/s | 4 g | 2.9 µA | 73 µA | 75% | 15 WPH |
| 10 mm | µC/cm² | 0.33 m/s | 1½ g | 1.5 µA | 37 µA | 79% | 10 WPH |
| 60 mm | | 0.13 m/s | ½ g | 0.57 µA | 14 µA | 88% | 5 WPH |
| 4 × 4 = 16 | 18 | 0.7 m/s | 3 g | 4.7 µA | 76 µA | 73% | 15 WPH |
| 15 mm | µC/cm² | 0.32 m/s | 1½ g | 2.2 µA | 35 µA | 83% | 10 WPH |
| 75 mm | | 0.12 m/s | 1 g | 0.83 µA | 13 µA | 94% | 5 WPH |
| 4 × 4 = 16 | 18 | 0.46 m/s | 2 g | 4.1 µA | 66 µA | 80% | 15 WPH |
| 20 mm | µC/cm² | 0.23 m/s | 1 g | 2.1 µA | 33 µA | 87% | 10 WPH |
| 75 mm | | 0.1 m/s | ½ g | 0.83 µA | 13 µA | 94% | 5 WPH |
| 3 × 3 = 9 | 18 | 0.48 m/s | 1½ g | 4.3 µA | 39 µA | 77% | 10 WPH |
| 20 mm | µC/cm² | 0.17 m/s | 1 g | 1.5 µA | 13 µA | 93% | 5 WPH |
| 100 mm | | | | | | | |
| 2 × 2 = 4 | 18 | 0.90 m/s | 2½ g | 8.2 µA | 33 µA | 70% | 10 WPH |
| 20 mm | µC/cm² | 0.46 m/s | 1 g | 4.1 µA | 17 µA | 77% | 5 WPH |
| 150 mm | | 0.41 m/s | 1½ g | 3.7 µA | 15 µA | 85% | 5 WPH |
| | | 0.38 m/s | 2½ g | 3.5 µA | 14 µA | 90% | 5 WPH | factor comprising a PD with sufficiently large size for single pass scanning stripe exposures including a large number of gray scales). Increasing the column number results in a reduction of the scan area down to the sub-field area addressed by one column, i.e. by a factor 1/(n*m) if n×m column are used, and therefore results in a significant reduction of the dead exposure time, as by slowing down the scanning speed the fraction of dead exposure time is scaled down linearly if the acceleration and jerk are not changed, as shown by the analytical formula for the turn-around time $T_1$ of a single turn around event:

$$T_1 = G/J + 2v_S/G$$

where $v_S$ is the scanning speed, G is the acceleration of the stage and J is the jerk of the stage. The total turn around time, i.e. the dead exposure time, is just the number of stripes in one sub-field times the time $T_1$.

A reasonable value for the upper limit of the number of columns is the number of chips per wafer, or in other words, each chip is preferably exposed by one column. Further, there is a minimum diameter of the column connected with the already mentioned minimum size of the aperture plate, which also defines an upper limit for the column density on the 300 mm wafer. To relax the stage requirements, one could also increase the stripe width at the same number of columns. Another bottleneck for the throughput is, certainly, the stochastic Coulomb interaction, but also space-charge-related distortion, which in general leads to a pattern-dependent distortion, and may lead to an additional blur contribution not acceptable for lithography. The acceptable current per column can be determined, so that for a given throughput the corresponding number of columns must be used in parallel in order to achieve the resolution for a given node at this throughput requirement. A typical current for an optimized column with 150 mm diameter at 100 keV electron energy at wafer is around 5 to 10 µA. To avoid any significant influence of space charge, around 3 to 5 µA per column may be used.

To relax the requirements for the source brightness one may increase the number of columns, and hence the number of parallel sources. There is a plurality of parameter configurations in which the multiple stripe exposure apparatus works. The flexibility for design, in particular optimizing the column number for given source parameters, stage parameters, imaging aberrations and space charge constraints with respect to an optimized throughput, represents another major advantage of the present invention.

Another major advantage of the invention, which is one more time due to the parallel writing strategy using parallel scanning stripe exposure, is connected to the wafer alignment during the exposure process, particularly to wafer heating. For the tool presented in U.S. Pat. No. 6,768,125 a scanning strategy was preferred for which the thermal input to the wafer was homogenized to best extent. But if the current is increased, as necessary for smaller nodes or higher throughputs, the use of only one column means a drastically higher current density and therefore increased heating power on the wafer. A system based on one column is not extendable for lower resolution. It was mentioned before that for increased current the column has to be shortened, which generally leads to a reduction of the stripe width. Therefore a throughput of 15 WPH to be achieved by a single column involves a significant heating load on the wafer, which may even lead to an evaporation of the resist material during exposure. On the other hand, by virtue of the invention, the beam power is distributed homogenously by many different columns over the wafer, resulting in an uncritical alignment and manageable thermal budget applying conventional wafer cooling. Concerning alignment it should further be mentioned, that the low scanning speed connected to the multi-column approach, typically in the range of a few centimeters per second, allows a dynamic tracking of the actual wafer position by alignment marks detected in during the scanning process on the wafer, or in particular, around the chips, for example during turn around.

The multiple scanning stripe exposure write strategy offers further significant advantages. In the first place, the total data stream is subdivided into several streams (2 to about 100, according to the number of columns used) which have only a fraction of the amount of the total data stream. This means that for example a 2.5 Tbit/s data stream, which is required for approximately 12 WPH at 45 nm node, is effectively divided by 4, 6, 9, 16 or more, generally i×j (with i, j being integers), according to the number of columns. The reduction of the data rate to be delivered to one column is a significant advantage offered by the present invention, and is based on the independent writing in non-overlapping subfields of the wafer. Data handling would be much more complicated if a write strategy other than described in the U.S. Pat. No. 6,768,125 was used, in which one data stream is shifted via shift register above an aperture plate, generating for 5 bit per pixel a plurality of gray scales and sufficient redundancy.

The scanning strategy described in the U.S. Pat. No. 6,768,125, where the full wafer is scanned stripe by stripe, the first chip down to the last chip in sequence in a meander-like fashion, can be employed with the present invention, with the modification that each image field does not scan across the whole wafer area but only one part of the area as explained above with reference to FIG. 5. If the number of chips is such that the borders of the subfields are inside a die, the most convenient scan strategy is one stripe after the other, beginning with the top to the bottom.

Referring again to FIGS. 1 and 2, the particle-optical lenses employed in the illumination and projection systems 10, 30 can be realized with electrostatic lenses EL or electromagnetic lenses ML. In the embodiment shown, the extraction system is electrostatic, and the condenser lens 13 of the illumination system is realized as an electrostatic lens L1 (FIG. 2). The projection optics system 30 comprises both electrostatic and magnetic lenses; more in detail, the first lens is an electrostatic lens L2, while the consecutive three lenses are magnetic lenses L3, L4, L5.

The lenses L1–L5 serve as main lenses determining the overall optical processing of the individual beams. Since they are operating in unison for all columns, they are fed common voltage and current supplies, respectively. In a (hypothetical) ideal setup with identical columns located in a surrounding with uniform electromagnetic background, the lenses L1–L5 would be sufficient for the illumination and projection systems. However, individual differences will render the imaging properties of the lens systems slightly different, for instance due to manufacturing tolerances or varying background fields. In order to correct for these individual deviations of the columns, subsidiary lenses LB1–LB5 are provided for the lenses L1–L5. The subsidiary lenses LB1–LB5 are positioned at suitable places before or after the corresponding main lens L1–L5; in special cases, they could also be placed in between. In contrast to the main lenses L1–L5, the subsidiary lenses are supplied individual voltages or currents for each of the columns, but since the subsidiary lenses only serve to correct the basic fields produced by the main lenses, the voltages/currents applied to the subsidiary lenses are considerably smaller than those of the main lenses. For example, with an electrostatic lens, such as the condenser lens L1, the voltages applied to the electrodes of the main lens L1 are in the order of kV, whereas the voltages that the subsidiary lens LB1 has to deal with is in the order of a few V or several 100 V only. It should be noted that it is not necessary that all four subsidiary lenses of the projection system 30 are actually present, since two of them will already enable sufficient control for correcting individual aberrations.

Figure 7:
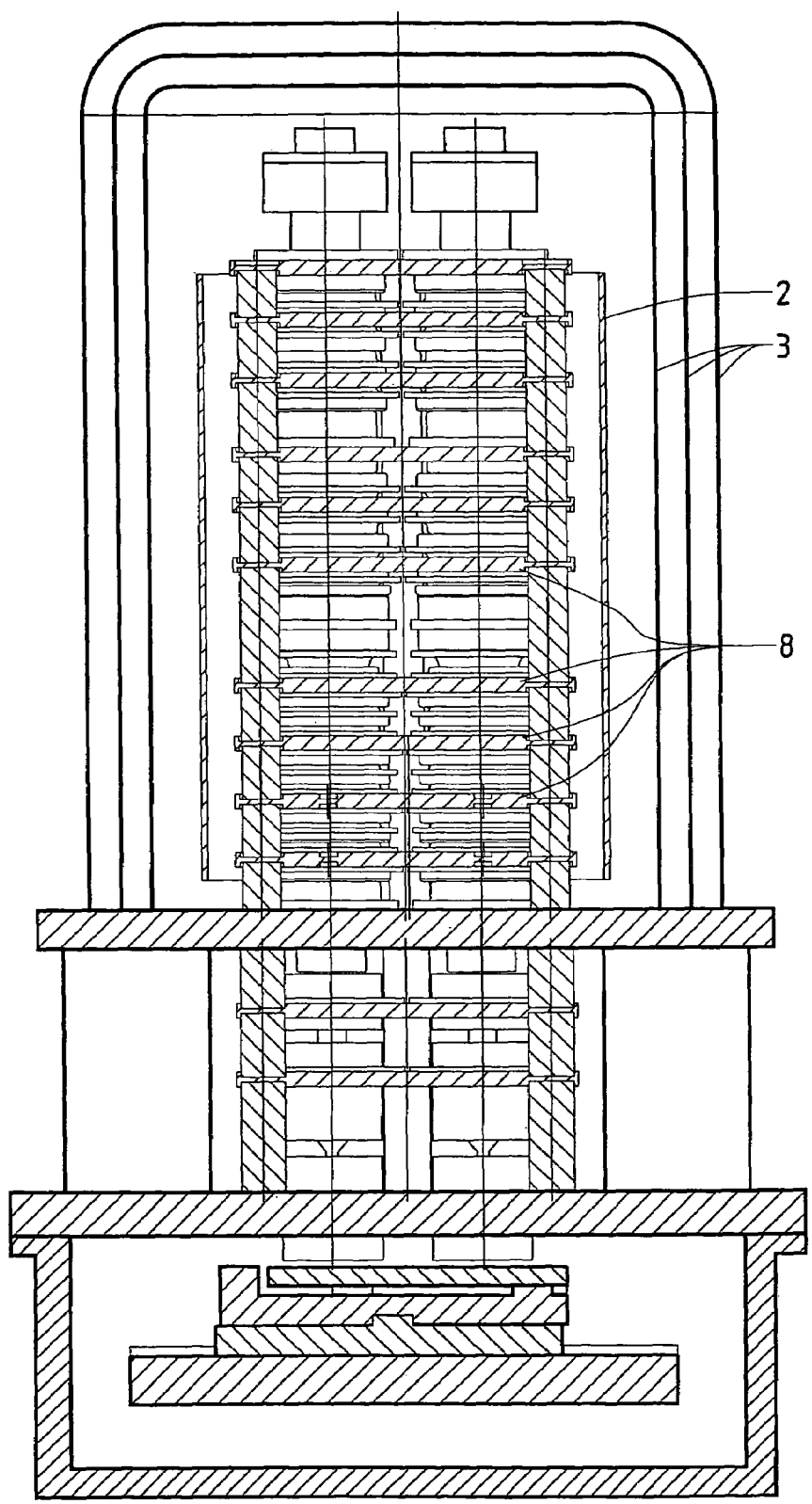
FIG. 7 shows the apparatus of FIG. 1 in another sectional view.

FIG. 7 shows another longitudinal section of the apparatus 1, with the cutting plane running between the columns 4. As can be seen, the columns are interconnected by strut plates 8 which also serve as electric connection between corresponding electrodes of the main lenses of the different columns. In contrast, it can be seen that each of the columns is provided with a PD device 20 of its own. Each column is held by a set of insulators which provide the required spacing of the electrodes against each other and against the housing 2. The strut plates 8 provide the electric contacts for the electrodes. The contacts for the high voltages applied to the electrodes are made to the strut plates 8; subsidiary voltages can be supplied by means of additional low-voltages sources (e.g., batteries). The connection between metal and insulator parts can be done by soldering or suitable screwing connections, in order to ensure the required rigidity of the entire support gear. The PD devices are held by kinematic mounts placed on, e.g., the next electrode. This ensures the reproducibility in the case that a PD device has to be replaces.

Figure 8:
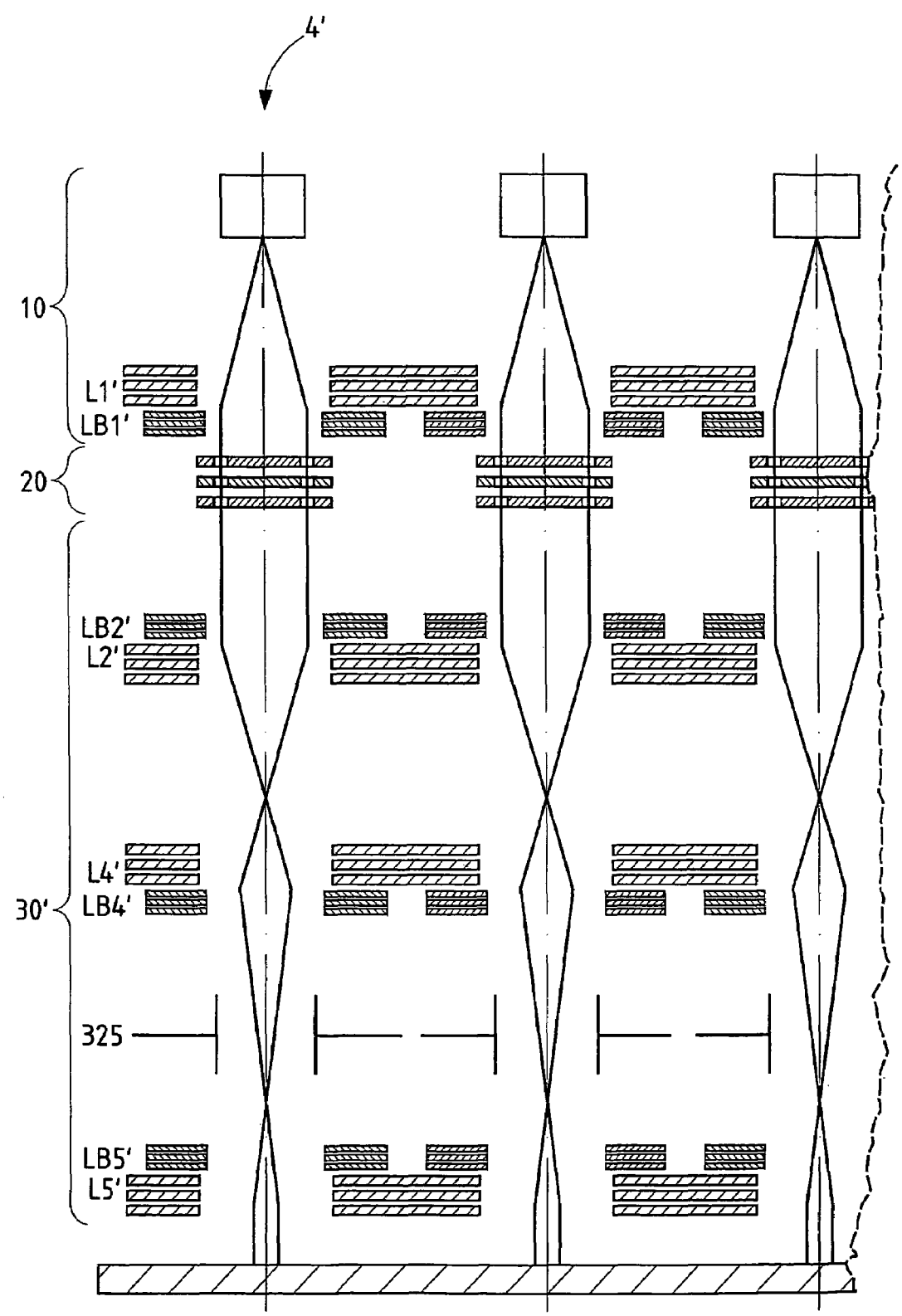
FIG. 8 shows another variant of the apparatus with a shortened projections optics.

It will be appreciated that any suitable layout of the particle-optical system which can be fit into the space of a column 4' may be used. FIG. 8 shows an optical system with a variant projection system 30' which is especially suitable to achieve a reduced length of the columns. The projection system 30' also realizes a demagnifying projection optics with two crossovers, however, with only three lenses L2', L4', L5'. This projection system does not form an approximately telecentric beam between the first and second stage, as compared to the optical system of FIG. 2. Also with the system of FIG. 8, each of the lenses L1, L2', L4', L5' may be provided with a respective subsidiary lens LB1, LB2', LB4', LB5'; however, it is not necessary that all three subsidiary lenses LB2', LB4', LB4' are actually present in the projection system 30', since two of them will already enable sufficient control for correcting individual aberrations.

Figure 9:
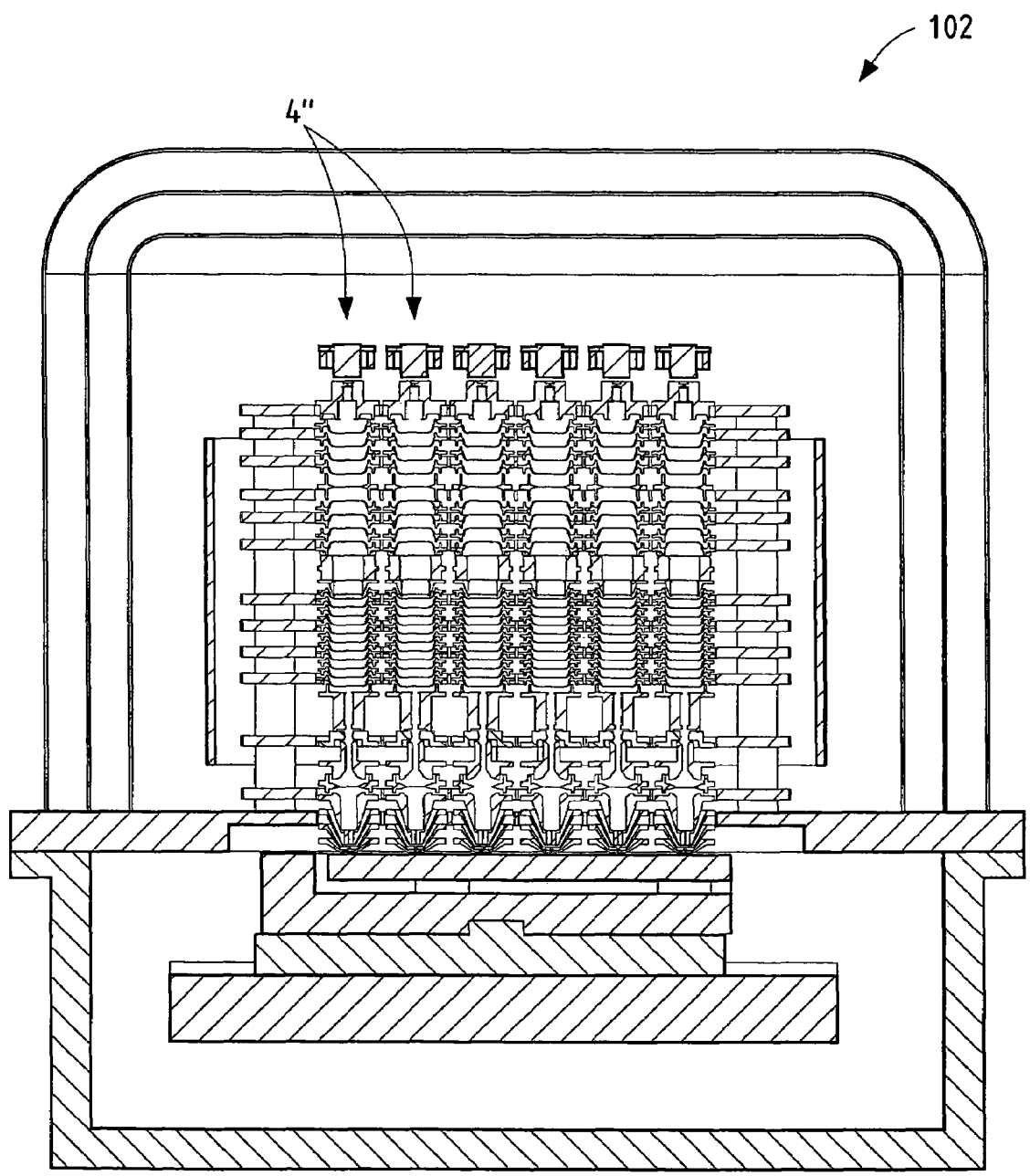
FIG. 9 shows a variant of the apparatus of FIG. 1 with an increased number of columns.

FIG. 9 shows a longitudinal section of a variant apparatus 102 with 42 columns arranged in an array of 6×6. The cut plane runs through one of the lines of particle optical columns 4'. In other respects, this apparatus 102 corresponds to the apparatus 1 shown in FIG. 1. It is worthwhile to note that the arrangement of the columns need not be a regular rectangular array, but can be any two-dimensional arrangement. One especially useful example is to arrange the columns in an arrangement mimicking the positions of the chip fields on the wafer target (cf. FIG. 5).

Figure 10:
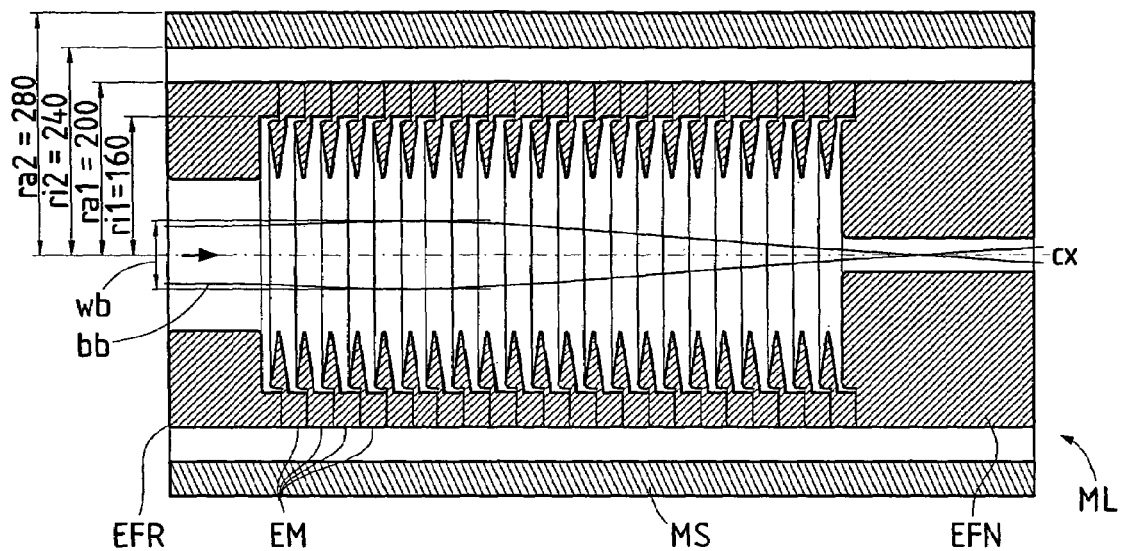
FIG. 10 shows a first versions of a multi-electrode column used as electrostatic lens.

In order to accommodate an electrostatic lens into the confined lateral space allotted to a column, for the electrostatic lenses EL of the apparatus 1 multi-electrode lenses are used employing a layout as displayed in the longitudinal section in FIG. 10. The multi-electrode lens ML comprises an electrode column consisting of a series of electrodes EM of substantially equal shape arranged along the optical axis. A front electrode EFR positioned at the front opening of the lens (i.e., where the electrons enter) and a final electrode EFN positioned at the end opening are provided in order to define the initial and the final electrostatic potentials that the electrons will be exposed to at entering and leaving the lens ML, respectively. Each of the electrodes EM is provided with its own electric feeding (not shown) for applying an individual electrostatic potential. The individual potential may be generated by means of a resistor array interpolating the individual electrostatic potentials from a small number of potentials supplied, for instance a minimum and a maximum potential. Individual supplies can also be fed directly from a power source (not shown), in particular when the number of electrodes EM is not too high. The use of multi-electrode lenses for a one-column based tool would involve a considerable and costly effort for feeding all electrons with the corresponding potentials from the outside into vacuum. A multi-column setup, according to the invention, allows a highly parallel use of power supplies, lowering costs and space requirements. The low voltage segments can be fed by battery-powered power supplies, which are controlled by the system computer, for example via optical links, placed inside the vacuum to further improve compactness and functionality.

Figure 10A:
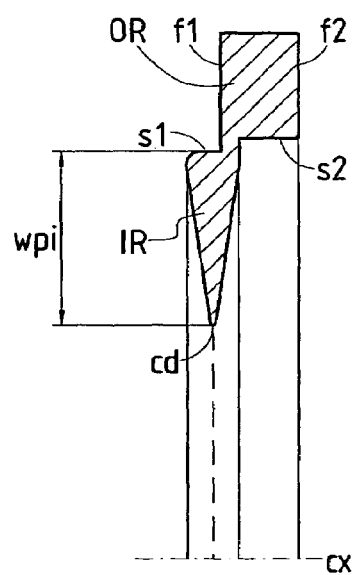
FIG. 10a shows an enlarged cross-sectional view of a single electrode of the multi-electrode colunm of FIG. 10.

The shape of a single electrode EM is illustrated in the longitudinal-sectional detail of FIG. 10a. The electrode EM is rotational symmetric around the optical axis, thus forming a ring surrounding the optical path of the electron beam. The electrode is composed of two main parts, namely an outer member ring OR and an inner portion IR protuding from the outer member ring OR inwards, i.e. toward the optical axis. The outer member ring has a cylindrical shape, with a front surface f1 and a back surface f2 which, respectively, face toward the next and previous electrode in the multi-electrode lens series. Between the back surface f2 of each electrode and the front surface f1 of the respective next electrode, a small gap is left. This gap is necessary since an electric voltage is present between the electrodes; the width of the gap is chosen according to the maximal allowable electric voltage between two neighboring electrodes in view of the electric properties of the residual gas in the lithography device.

The inner portion IR of the electrode EM forms an inner member ring which tapers inwards ending in a circular edge cd directed toward the optical axis. In order to obtain a well-defined lens field, the innermost part of the inner portion IR should be thin; however, it should not have a sharp edge in order to avoid field emission of electrons. In view of mechanic stability of the inner portion IR, the thickness should increase with the distance from the optical axis cx, and should be at least 1/10 of the width wpi of the inner portion measured along a radial direction.

The inner member ring IR is joined to the outer member ring OR in a manner that a shoulder s1 is formed which covers the gap between consecutive electrodes. Preferably, in addition to the magnetic shield MS (corresponding to the shielding 3 of FIGS. 1 and 4) surrounding the lens ML, also the electrodes EM may be made from a soft-magnetic material—that is, a magnetic material having a steep but narrow hysteresis loop—with a high permeability at environmental conditions of at least 100, preferably at least 300.

Such materials are well-known from prior-art. For example, soft iron or so-called permalloy may be used as the bulk material for the electrodes EM. In that case, the presence of the outer shoulder s1 helps to prevent magnetic field lines from 'leaking in' into the inner space, since a field line traversing a gap will meet the shoulder s1 and, therefore, enter the magnetic material which will lead the field line around the inner space. At the inner side of the member ring OR, an inner shoulder s2 is present corresponding to the outer shoulder s1, in order to leave space for the inner member ring of the consecutive electrode (not shown in FIG. 10a).

In order to avoid a buildup of charge at insulating layers—which would change the electrode potential—the electrodes are preferably coated with a thin layer of a well conducting material, such as ZrN or TiN.

Even if the electrodes are not made of a ferromagnetic material and therefore are not part of the magnetic shielding (single shielding), still a two times higher shielding factor is obtained with less than half of the material in case of the multi-electrode lens, as compared for instance with an Einzel-lens of same focal length, due to the smaller geometry of the outer shield. So in this case as well, the reduction of the diameter gives a substantial advantage for the magnetic shielding.

From the experience in electrostatic linear particle accelerators, it is known that the production of secondary electrons at the acceleration electrodes may lead to electron multiplication, an effect comparable to that exploited in a secondary electron multiplier. The increasing amount of electrons in the accelerator tube leads to increasing current through the electrodes which induces voltage instability until possible voltage breakdown.

In a charged-particle optical system of the invention, secondary electrons will also be responsible for other undesired effects, such as charging up of insulators and insulating layers and thereby deteriorating the optical performance, or creation of secondary positive ions which will be accelerated towards the object (mask, aperture plate or the like) to be imaged.

Therefore, it is important to minimize the number of secondary electrons emitted into the optical column. This is done by shaping the (radial symmetric) electrodes in a way that the electric field at the "rear" side of the electrode, i.e. the electrode surface oriented towards the higher energy, accelerates the secondary electrons emitted from this electrode surface directly to the next electrode, i.e. to the "front" surface facing the emitting surface. To this effect, close to the electrode hole (through which the charged particles travel), the rear surface of each electrode should be basically conical, with the cross section line of the cone optionally being curved, the base of the cone lying towards the low energy end of the system. Secondary electrons produced at the "front" surface, the one oriented towards the low energy end, of the electrodes will be accelerated back to this surface and have no chance to enter the optical column or to be multiplied.

Figure 11:
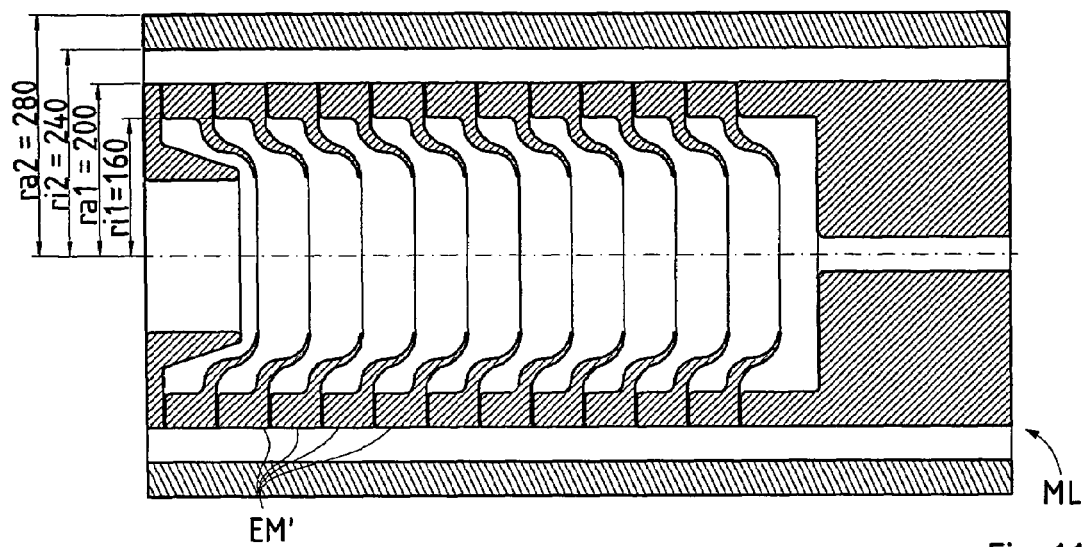
FIG. 11 shows a second version of a multi-electrode column used as electrostatic lens.

For avoidance of such secondary electron effects, in another suitable multi-electrode column shown in FIG. 11, the inner portion IR' of the electrodes EM' have a curved shape. The inner portion IR' is provided with a concave surface cv extending outward from the circular edge cd. It is oriented so as to face toward the direction from where the charged particles enter the electrode column.

Figure 11A:
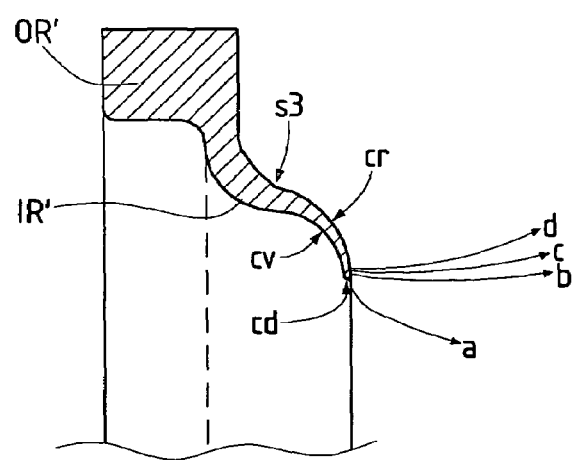
FIG. 11a shows an enlarged cross-sectional view of a single electrode of the multi-electrode column of FIG. 11.

In FIG. 11a, one electrode is shown in more detail, together with the directions of some 1 eV electrons starting from the electrode surface. As can be seen from FIG. 11a, the "conical" behavior of the rear surface cross section line cr starts only at a distance from the innermost radius of the electrode (the radius of the open width of the electrode as seen along the optical axis of the electrode), since the contour of the edge cd is shaped as a circle cd of finite dimension. The minimum radius of the circle cd is determined by the maximum field strength allowed in vacuum, so as to avoid sparkling from the electrode.

Examples of electron trajectories are sketched in FIG. 11a, of which only the electron labeled 'a' will be emitted into the inner part of the optical column, whereas electrons 'b', 'c' and 'd' will be accelerated towards the front surface of the neighboring electrode.

In the variant shown in FIG. 11a, the cross section lines of the inner part of the 'front' surface cv and the 'rear' surface cr are also circular. The radii of the circles are chosen according to material stability as well as high voltage stability criteria. Shapes different from circles may also be chosen, e.g. straight lines corresponding to "standard" cone segments when rotated around the symmetry axis, at the expense that the region from which secondary electrons are emitted into the optical column is a little bit larger. In the variant of FIGS. 11 and 11a, the inner portion IR' extends over the outer member ring OR' at the back side, so it is now the curved surface s3 at the backside of the inner portion IR' which serves as shoulder preventing magnetic field lines from 'leaking in' through the gap that is formed between the outer member rings OR' of consecutive electrodes.

We claim:

1. A charged-particle multi-beam exposure apparatus (1) for exposure of a target (41) with a plurality of beams of electrically charged particles, said particle beams propagating along parallel beam paths towards the target (41),
   wherein for each of said particle beams an illumination system (10), a shaping means (20) and a projection optics system (30) are provided, with the illumination system (10) being adapted to produce the beam and form it into a substantially telecentric beam illuminating the shaping means, the shaping means (20) being adapted to form the shape of the illuminating beam into a desired pattern, and the projection optics system (30) being adapted to project an image of the beam shape defined in the shaping means onto the target (40),
   wherein the shaping means (20) of each particle beam is realized as a pattern definition means for defining a multitude of beamlets in the respective particle beam, said means being adapted to let pass the illuminating beam only through a plurality of apertures defining the shape of beamlets permeating said apertures, said means further comprising a blanking means to switch off the passage of selected beamlets from the respective paths of the beamlets,
   wherein the illumination system (10) and/or the projection optics system (30) comprise particle-optical lenses having lens elements (L1, L2, L3, L4, L5) common to more than one particle beam.

2. The apparatus of claim 1, wherein the common lens elements are realized as individual lens elements provided for each of the particle beams and connected to a unique electrical supply.

3. The apparatus of claim 1, wherein the common lens elements are realized by a common structural member surrounding each of the particle beams.

4. The apparatus of claim 1, wherein the particle-optical lenses of the illuminating system (10) and the projection optics system (30) comprise lens elements (L1, L2, L3, L4, L5) common to more than one particle beam as well as lens elements (LB1, LB2, LB3, LB4, LB5) which are individual to one particle beam respectively and connected to individual electrical supplies.

5. The apparatus of claim 1, wherein the particle-optical lenses of the illuminating system (10) and the projection optics system (30) comprise electrostatic lenses (L1, L2, L3, L4, L5) which are common to multiple particle beams as well as electrostatic lens elements (LB1, LB2, LB3, LB4, LB5) which are individual to one particle beam respectively for introducing individual corrections of the effect of the common electrostatic lenses (L1, L2, L3, L4, L5).

6. The apparatus of claim 1, wherein the apertures in the pattern definition means (20) have identical shapes.

7. The apparatus of claim 1, wherein the apertures in the pattern definition means (20) have shapes which produce images of identical shape on the target (41).

8. The apparatus of claim 1, wherein the projection system comprises three or more focusing elements realizing reducing projection optics having two consecutive cross-overs.

9. The apparatus of claim 1, comprising a projection lens system having 4 lenses realizing a 2-stage reduction system, in which parts of the beam are used for beam adjustment and beam analysis at the position of the intermediate image, located between the first and second cross-over.

10. The apparatus of claim 1, comprising a target stage (40) adapted to move the target (41) under the multiple beams according to a predefined scanning motion according to which the beams cover the total area of the target to be exposed in the course of the exposure process.

11. The apparatus of claim 10, wherein the target stage (40) is adapted to perform a scanning motion according to which each beam covers the total area of a sub-field of the target, with the sub-fields altogether totaling to the total area of the target to be exposed.

12. The apparatus of claim 10, wherein the target stage (40) is adapted to perform a scanning motion according to which each beam covers the total area of a sub-field of the target, with the sub-fields of the beams covering separate parts of the total area of the target to be exposed.

13. The apparatus of claim 10, wherein the target stage (40) is adapted to perform a scanning motion according to which each beam covers the total area of a sub-field of the target in a single pass scanning stripe exposure pattern (FIG. 5).

14. The apparatus of claim 1, wherein for each particle beam a pattern definition means is provided, having a pattern field (pf) in which the apertures are located, said pattern field having a length (L) of at least 500 times the size (w) of the apertures.

15. The apparatus of claim 1, wherein for each particle beam a pattern definition means is provided with at least 20000 apertures whose transparency to the particle beam can be electronically controlled between switched on and off states.

16. The apparatus of claim 1, comprising an electrostatic lens (ML) having an electrode column realized as a series of at least 3 electrodes of substantially equal shape of substantially rotational symmetry (EFR, EM, EFN) surrounding the respective beam path, with said electrodes being arranged in consecutive order coaxially along an optical axis representing the center of the beam path and said electrodes being provided with electric supplies for feeding different electrostatic potentials to the respective electrodes.

17. The apparatus of claim 16, wherein the outer radius of all electrodes of the electrostatic lens is not larger than 5 times the largest radius of said particle beam path within the lens.

18. The apparatus of claim 16, wherein the electrodes (EM) of the electrode column are at least partially made from a soft-magnetic material having at environmental conditions a relative permeability greater than 100.

19. The apparatus of claim 18, wherein the relative permeability is greater than 300.

20. The apparatus of claim 16, further comprising a magnetic shielding tube (MS, 3) made from a soft-magnetic material surrounding the electrode column and extending along the direction of the optical axis at least over the length of the electrode column.

21. The apparatus of claim 16, wherein outer portions (OR) of the electrodes (EM) of the electrode column(s) have corresponding opposing surfaces (f1, f2) facing toward the next and previous electrodes, respectively.

22. The apparatus of claim 16, wherein each electrode (EM) of the electrode column comprises an outer member ring (OR) having a cylindrical shape with corresponding opposing surfaces (f1, f2) facing toward the next and previous electrodes, respectively, and further comprises an inner member ring (IR) with a circular edge (cd) directed toward the optical axis.

23. The electrostatic lens of claim 22, wherein the inner member ring (IR) is provided with a concave surface (cv) extending outward from the circular edge (cd) and facing toward the direction from where the charged particles enter the electrode column.

* * * * *